US011551918B2

(12) United States Patent
Imakita et al.

(10) Patent No.: US 11,551,918 B2
(45) Date of Patent: Jan. 10, 2023

(54) FILM FORMING APPARATUS

(71) Applicant: Tokyo Electron Limited, Tokyo (JP)

(72) Inventors: Kenichi Imakita, Yamanashi (JP);
Yasuhiko Kojima, Yamanashi (JP);
Atsushi Gomi, Yamanashi (JP);
Hiroyuki Yokohara, Yamanashi (JP);
Hiroshi Sone, Tokyo (JP)

(73) Assignee: TOKYO ELECTRON LIMITED,
Tokyo (JP)

( * ) Notice: Subject to any disclaimer, the term of this patent is extended or adjusted under 35 U.S.C. 154(b) by 0 days.

(21) Appl. No.: 16/883,543

(22) Filed: May 26, 2020

(65) Prior Publication Data

US 2020/0381226 A1 Dec. 3, 2020

(30) Foreign Application Priority Data

May 28, 2019 (JP) .............................. JP2019-098970

(51) Int. Cl.
*H01J 37/34* (2006.01)
*C23C 14/34* (2006.01)
*H01J 37/32* (2006.01)

(52) U.S. Cl.
CPC ...... *H01J 37/3441* (2013.01); *C23C 14/3407* (2013.01); *H01J 37/3244* (2013.01); *H01J 37/3423* (2013.01); *H01J 37/3435* (2013.01)

(58) Field of Classification Search
CPC ............... H01J 37/3244; H01J 37/3423; H01J 37/3435; H01J 37/3441; H01J 37/3447;

(Continued)

(56) References Cited

U.S. PATENT DOCUMENTS 5,433,835 A * 7/1995 Demaray ............ H01J 37/3435
204/298.12
2006/0110620 A1* 5/2006 Lin ......................... C23C 28/44
428/650

(Continued)

FOREIGN PATENT DOCUMENTS

JP 07-034236 * 2/1995
JP H07-034236 A 2/1995

(Continued)

OTHER PUBLICATIONS

Machine Translation JP 07-034236 (Year: 1995).*
Machine Translation JP 10-025568 (Year: 1998).*

*Primary Examiner* — Rodney G McDonald
(74) *Attorney, Agent, or Firm* — Venjuris, P.C.

(57) ABSTRACT

A film forming apparatus includes: a processing container; a substrate holder that holds the substrate in the processing container; and a target assembly disposed in an upper side of the substrate holder. The target assembly includes: a target made of metal, including a main body and a flange provided around the main body, and emitting sputter particles from the main body; a target holder including a target electrode configured to supply power to the target, and holding the target; a target clamp that clamps the flange of the target to the target holder; and an anti-deposition shield provided around the main body of the target to cover the flange, the target clamp, and the target holder, and having a labyrinth structure in which an inner tip end thereof is disposed to enter a recess between the main body of the target and the target clamp.

17 Claims, 7 Drawing Sheets

(58) Field of Classification Search
CPC ... C23C 14/0068; C23C 14/081; C23C 14/10; C23C 14/165; C23C 14/185; C23C 14/3407; C23C 14/5853
USPC .................................................. 204/298.11
See application file for complete search history.

(56) References Cited

U.S. PATENT DOCUMENTS

| | | | | |
|---|---|---|---|---|
| 2013/0048489 | A1* | 2/2013 | Yamaguchi | H01J 37/3441 |
| | | | | 204/192.15 |
| 2013/0098757 | A1* | 4/2013 | Ohno | H01J 37/32871 |
| | | | | 204/298.11 |
| 2014/0102889 | A1* | 4/2014 | Kajihara | C23C 14/3464 |
| | | | | 204/298.11 |
| 2014/0284210 | A1* | 9/2014 | Ishihara | H01J 37/3411 |
| | | | | 204/298.11 |
| 2016/0032446 | A1* | 2/2016 | Gomi | H01J 37/3244 |
| | | | | 204/192.12 |

FOREIGN PATENT DOCUMENTS

| | | | |
|---|---|---|---|
| JP | 10-025568 | * | 1/1998 |
| JP | 2016-033244 A | | 3/2016 |
| JP | 5956611 B2 | | 7/2016 |
| JP | 6095806 B | | 3/2017 |
| KR | 10-2014-0108263 A | | 9/2014 |
| KR | 10-2016-0016644 A | | 2/2016 |

* cited by examiner

FILM FORMING APPARATUS

CROSS-REFERENCE TO RELATED APPLICATIONS

This application is based on and claims priority from Japanese Patent Application No. 2019-098970 filed on May 28, 2019 with the Japan Patent Office, the disclosure of which is incorporated herein in its entirety by reference.

TECHNICAL FIELD

The present disclosure relates to a film forming apparatus.

BACKGROUND

Sputtering that deposits sputter particles from a target on a substrate has been used as a technique for forming a metal film. Japanese Patent Application Laid-Open No. 2016-033244 discloses that sputter particles from a metal target are deposited on a substrate provided in a processing container to form a metal film such as Mg. Further, it is also disclosed that, after forming the metal film, oxygen is supplied into the processing container so as to oxidize the metal film to form a metal oxide film. It is also disclosed that such a metal oxide film is applied to, for example, a metal oxide film used in a magnetoresistive random access memory (MRAM).

Further, Japanese Patent No. 6095806 discloses a sputtering apparatus including an anti-deposition member that suppresses sputter particles from being directly attached to an inner surface of a vacuum container.

SUMMARY

An aspect of the present disclosure provides a film forming apparatus that forms a metal film on a substrate. The film forming apparatus includes: a processing container; a substrate holder that holds the substrate in the processing container; and a target unit disposed in an upper side of the substrate holder. The target unit includes: a target made of metal, including a main body and an annular flange provided around the main body, and configured to emit sputter particles from the main body; a target holder including a target electrode that supplies power to the target, and configured to hold the target flange of the target; and an anti-deposition shield provided around the main body of the target to cover the flange, a target clamp, and the target holder, and having a labyrinth structure in which an inner tip end thereof is disposed to enter a recess between the main body of the target and the target clamp.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described in detail with reference to the drawings.

Figure 1:
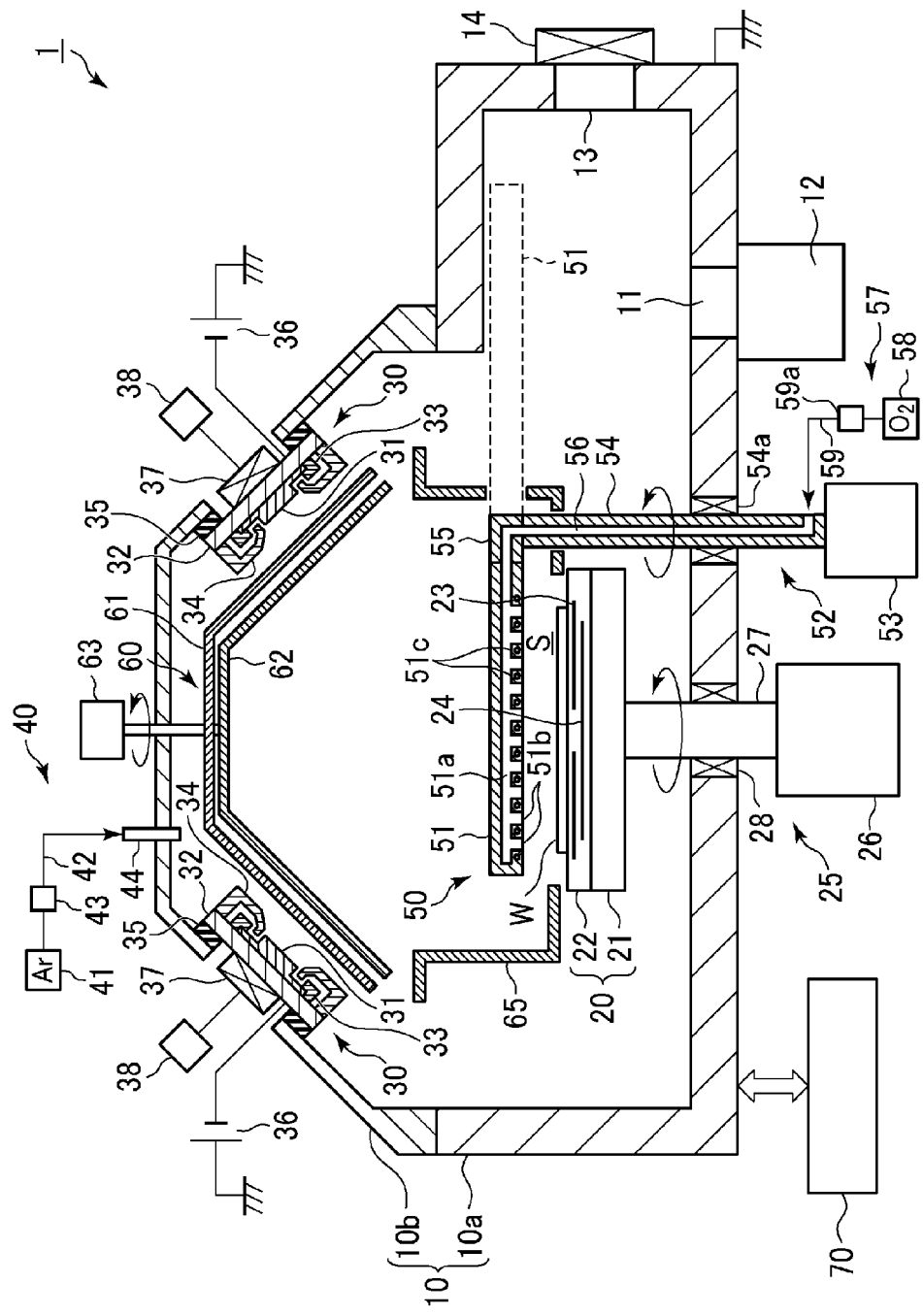
FIG. 1 is a cross-sectional view illustrating a film forming apparatus according to an embodiment.

FIG. 1 is a cross-sectional view illustrating a film forming apparatus according to an embodiment. A film forming apparatus 1 according to the embodiment deposits a metal film on a substrate W by sputtering, and then, forms a metal oxide film by performing an oxidation processing. For example, a wafer made of AlTiC, Si, or glass may be used as the substrate W, but the present disclosure is not limited thereto.

The film forming apparatus 1 includes a processing container 10, a substrate holder 20, a target unit 30, a gas supply 40, an oxidizing gas introducing mechanism 50, a partition 60, and a controller 70.

The processing container 10 is made of, for example, aluminum, and defines a processing chamber in which the substrate W is processed. The processing container 10 is connected to a ground potential. The processing container 10 includes a container body 10a that is opened at its upper portion, and a cover 10b that is provided so as to close the upper opening of the container body 10a. The cover 10b forms a truncated cone shape.

An exhaust port 11 is formed in the bottom portion of the processing container 10, and an exhaust device 12 is connected to the exhaust port 11. The exhaust device 12 includes a pressure control valve and a vacuum pump, and the inside of the processing container 10 is evacuated to a predetermined vacuum degree by the exhaust device 12.

A carrying-in/out port 13 is formed on the side wall of the processing container 10 to carry the substrate W into or out of an adjacent transfer chamber (not illustrated). The carrying-in/out port 13 is opened/closed by a gate valve 14.

The substrate holder 20 has a substantially disc shape, is provided in the vicinity of the bottom portion in the processing container 10, and is configured to horizontally hold the substrate W. The substrate holder 20 includes a base 21 and an electrostatic chuck 22 in the embodiment. The base 21 is made of, for example, aluminum. The electrostatic chuck 22 is made of a dielectric, and an electrode 23 is provided therein. A DC voltage is applied to the electrode 23 from a DC power supply (not illustrated), and due to the caused electrostatic force, the substrate W is electrostatically adsorbed to the surface of the electrostatic chuck 22. In the illustrated example, the electrostatic chuck 22 is a bipolar type, but may be a monopolar type.

Further, a heater 24 is provided in the substrate holder 20. The heater 24 has, for example, a heating resistance element, and generates heat by being supplied with power from a heater power supply (not illustrated) to heat the substrate W. The heater 24 is used as a first heater when oxidizing a metal film deposited on the surface of the substrate W. When the metal is Mg, the heater 24 heats the substrate W to a temperature within a range of 50° C. to 300° C. In FIG. 1, the heater 24 is provided in the electrostatic chuck 22, but may be provided in the base 21.

The substrate holder 20 is connected to the driving unit 25. The driving unit 25 includes a driving device 26 and a support shaft 27. The driving device 26 is provided below the processing container 10. The support shaft 27 extends from the driving device 26 through the bottom wall of the processing container 10, and a tip end thereof is connected to a bottom center of the substrate holder 20. The driving device 26 is configured to rotate and move up and down the substrate holder 20 via the support shaft 27. A space between the support shaft 27 and the bottom wall of the processing container 10 is sealed by a sealing member 28. By providing the sealing member 28, it is possible to rotate and move up and down the support shaft 27 while maintaining the inside of the processing container 10 in a vacuum state. For example, a magnetic fluid seal may be used as the sealing member 28.

Figure 2:
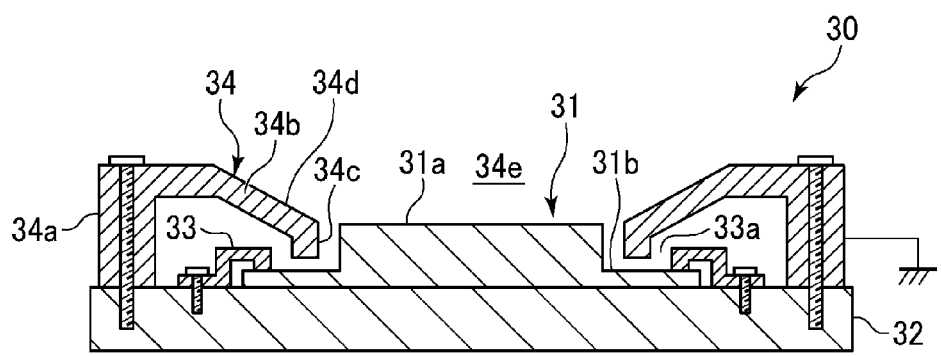
FIG. 2 is a cross-sectional view illustrating a target unit of the film forming apparatus in FIG. 1.
Figure 3:
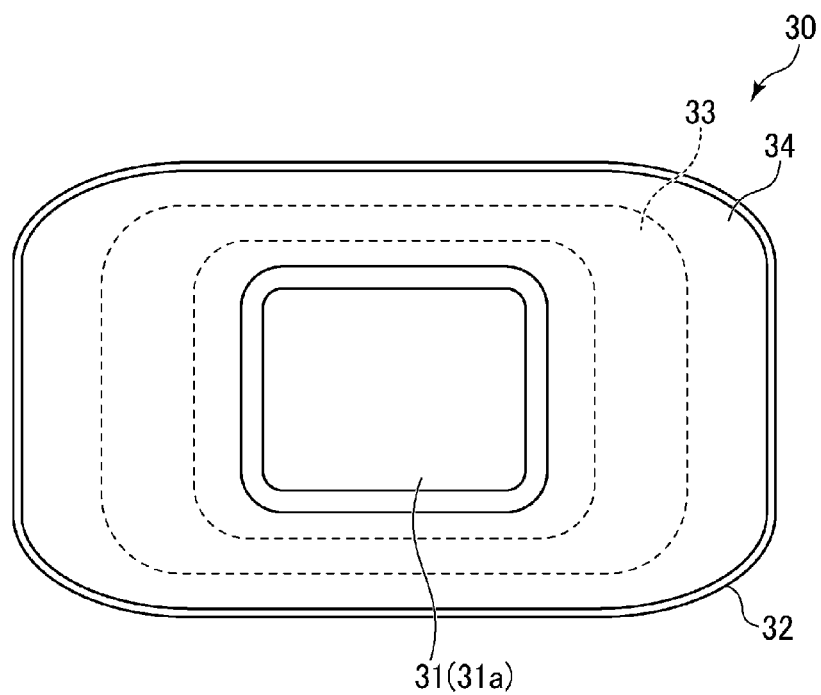
FIG. 3 is a plan view illustrating the target unit in FIG. 2.

The target unit 30 is provided above the substrate holder 20. In the example, two target units 30 are provided. As illustrated in an enlarged manner in FIG. 2 that is a cross-sectional view and in FIG. 3 that is a plan view, the target unit 30 has a target 31, a target holder 32, a target clamp 33, and an anti-deposition shield 34.

The target 31 is made of the metal that constitutes a metal film to be deposited, and has a main body 31a having a rectangular shape in a plan view and a flange 31b around the main body 31a. The metal that constitutes the target 31 is appropriately selected according to the type of the metal film to be formed, and, examples thereof include Mg or Al. In the target 31, sputter particles are emitted from the surface of the main body 31a by applying a voltage as described later.

The target holder 32 holds the target 31, and is attached obliquely to the substrate W, on an inclined surface of the cover 10b of the processing container 10 via an insulating member 35. The target holder 32 is electrically connected to the target 31, and also functions as a target electrode that supplies power to the target 31 from a power supply described later. The target electrode may be a part of the target holder 32. That is, the target holder 32 includes the target electrode.

The target clamp 33 is configured to clamp the flange 31b of the target 31 to the target holder 32. The target clamp 33 is provided in an annular shape along the flange 31b and screwed to the target holder 32 to press the flange 31b.

The anti-deposition shield 34 is made of a conductive metal such as Al, has an annular shape, and is grounded. The anti-deposition shield 34 suppresses the sputter particles emitted from the target 31 from wrapping around the members on the back side of the target, for example, the wall of the processing container 10, the target holder 32, and the target clamp 33. Further, the anti-deposition shield 34 also has a function of regulating the emission direction of the sputter particles emitted from the target 31. The anti-deposition shield 34 is provided around the main body 31a of the target 31 to cover the flange 31b of the target 31, the target clamp 33, and the target holder 32. Although not illustrated, the anti-deposition shield 34 and the target holder 32 are electrically insulated from each other, for example, by fixing with an insulating material therebetween.

The anti-deposition shield 34 has an outer portion 34a, an intermediate portion 34b, and an inner portion 34c. The outer portion 34a is attached to the target holder 32 by screwing outside the target clamp 33, and extends to a position higher than the height of the main body 31a of the target 31 so as to be away from the target holder 32. Further, the intermediate portion 34b extends from an inner end of the outer portion 34a toward a center of the target 31. The intermediate portion 34b has a slope 34d approaching to the main body 31a of the target 31 toward the center of the target 31. The inner portion 34c extends downward from an inner end of the intermediate portion to form an inner tip end of the anti-deposition shield 34, and is disposed to enter a recess 33a between the main body 31a of the target 31 and the target clamp 33 so as to have a labyrinth structure. With the slope 34d formed in the intermediate portion 34b, a space 34e surrounded by the anti-deposition shield 34 (the intermediate portion 34b) is formed above the target 31.

Figure 4:
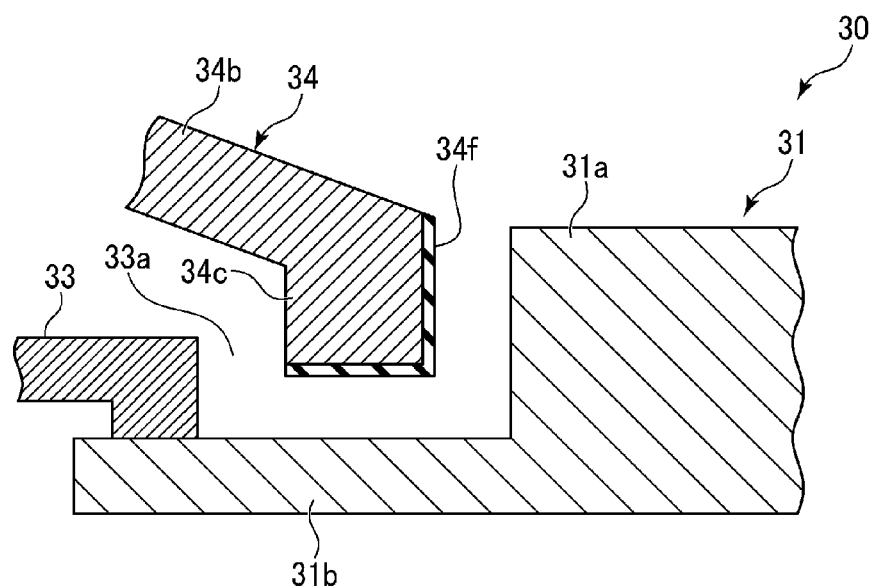
FIG. 4 is a cross-sectional view illustrating an inner tip end of an anti-deposition shield and an arrangement state of a target in the target unit.

As illustrated in FIG. 4, the anti-deposition shield 34 has an insulating film 34f formed on the surface of the inner portion 34c facing the target 31 (the main body 31a and the flange 31b). With the insulating film 34f formed on the surface facing the target 31, it is possible to suppress micro arc between the anti-deposition shield 34 and the target 31.

The insulating film 34f may be made of a material having a good adhesion to a base metal and sputter particles, and for example, an oxide film such as $Al_2O_3$, MgO, or $SiO_2$, or a nitride film such as MN may be used. A sprayed film formed by spraying may be appropriately used as the insulating film 34f.

When the base material of the anti-deposition shield 34 is Al, it is appropriate to use $Al_2O_3$ as the insulating film 34f. $Al_2O_3$ may be formed with a good adhesion to Al. Further, when using Mg or Al as sputter particles, $Al_2O_3$ may be formed with a good adhesion to the sputter particles.

Figure 5:
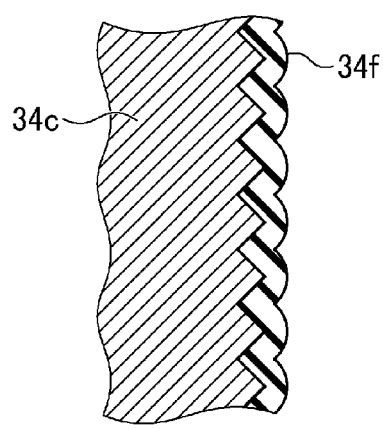
FIG. 5 is an enlarged cross-sectional view illustrating a base material and an insulating film of the anti-deposition shield.

When the base material of the anti-deposition shield 34 is Al, in order to improve the adhesion to the insulating film 34f, as illustrated in FIG. 5, the surface may be roughened, and the surface roughness Ra may be in a range of 18 μm to 28 μm. The surface roughness may be implemented by spraying Al on the surface of the base material. As described above, when an $Al_2O_3$ sprayed film is formed on the Al surface as the insulating film 34f, the film thickness may be in a range of 150 μm to 250 μm, and the surface roughness Ra may be in a range of 2.2 μm to 4.2 μm. Since $Al_2O_3$ has a high melting point, although $Al_2O_3$ is formed on the rough Al surface having a Ra of 18 μm to 28 μm, the surface roughness becomes small. When the thickness of the $Al_2O_3$ sprayed film is smaller than the range, the insulating property is easily lost, and when the thickness is larger than the range, the film is easily peeled off due to stress. Further, when the surface roughness is smaller than the range, the metal oxide film attached to the $Al_2O_3$ sprayed film is easily peeled off, and when the surface roughness is larger than the range, a tip of the unevenness of the $Al_2O_3$ sprayed film may be broken.

In the embodiment, descriptions are made on the case where the number of the target units 30 is two. However, the present disclosure is not limited thereto, and the number of the target units 30 may be any number of one or more.

As illustrated in FIG. 1, the target holder 32 is connected to a power supply 36. In the example, the power supply 36 is a DC power supply, but may be an AC power supply. A voltage from the power supply 36 is applied to the target 31 through the target holder 32. A cathode magnet 37 is provided on a side of the target holder 32 opposite to the target 31. The cathode magnet 37 is connected to a magnet driving unit 38.

The gas supply 40 includes a gas supply source 41, a gas supply pipe 42 extending from the gas supply source 41, a flow rate regulator 43 such as a mass flow controller provided in the gas supply pipe 42, and a gas introducing member 44. An inert gas, for example, a rare gas (FIG. 1 illustrates an example of Ar gas) such as Ar, He, Ne, and Kr as a gas excited in the processing container 10 is supplied to the processing container 10 through the gas supply pipe 42 and the gas introducing member 44 from the gas supply source 41.

The gas from the gas supply 40 is supplied into the processing container 10. The supplied gas is excited by applying a voltage to the target 31 through the target holder 32 from the power supply 36, and generates plasma. Meanwhile, when the cathode magnet 37 is driven by the magnet driving unit 38, a magnetic field is generated around the target 31, whereby the plasma is concentrated in the vicinity of the target 31. Then, positive ions in the plasma collide with the target 31, and thus, the constituent metal is emitted as sputter particles from the target 31, and the emitted metal is deposited on the substrate W.

The sputter particles may be emitted by applying a voltage to both of the two targets 31 from both of the two power supplies 36, or the sputter particles may be emitted by applying a voltage to one of the two targets 31.

The oxidizing gas introducing mechanism 50 has a head 51, a moving mechanism 52, and an oxidizing gas supply 57. The head 51 forms a substantially disc shape. The moving mechanism 52 includes a driving device 53 and a support shaft 54. The driving device 53 is provided below the processing container 10. The support shaft 54 extends from the driving device 53 through the bottom wall of the processing container 10, and a tip end thereof is connected to the bottom portion of a connecting portion 55. The connecting portion 55 is bonded to the head 51.

A space between the support shaft 54 and the bottom wall of the processing container 10 is sealed by a sealing member 54a. For example, a magnetic fluid seal may be used as the sealing member 54a. The driving device 53 is configured to be capable of turning the head 51 between an oxidation processing position existing in a processing space S immediately above the substrate holder 20 and a retreat position (indicated by a broken line in the drawing) away from the processing space S, by rotating the support shaft 54.

A gas diffusion space 51a that forms a circular shape and a plurality of gas ejection holes 51b extending downward from the gas diffusion space 51a and opened are formed inside the head 51. A gas line 56 is formed in the support shaft 54 and the connecting portion 55, and one end of the gas line 56 is connected to the gas diffusion space 51a. The other end of the gas line 56 exists below the processing container 10, and is connected to the oxidizing gas supply 57. The oxidizing gas supply 57 includes a gas supply source 58, a gas supply pipe 59 extending from the gas supply source 58 and connected to the gas line 56, and a flow rate regulator 59a such as a mass flow controller provided in the gas supply pipe 59. An oxidizing gas, for example, an oxygen gas ($O_2$ gas) is supplied from the gas supply source 58. When the substrate holder 20 is in the oxidation processing position, the oxidizing gas is supplied to the substrate W held by the substrate holder 20 through the gas supply pipe 59, the gas line 56, the gas diffusion space 51a, and the gas ejection holes 51b.

A heater 51c is provided in the head 51. Various heating methods such as resistance heating, lamp heating, induction heating, and microwave heating may be applied to the heater 51c. The heater 51c generates heat by being supplied with power from a heater power source (not illustrated). The heater 51c is used as a second heater when crystallizing a metal oxide film formed on the substrate. When the metal is Mg, the heater 51c heats the substrate W to a temperature within a range of 250° C. to 400° C. When supplying an oxidizing gas (e.g., $O_2$ gas) from the head 51, the heater 51c may be applied for the purpose of heating the oxidizing gas. Therefore, it is possible to further reduce the time required for oxidizing the metal.

The partition 60 serves as a shield member that shields the target 31, and defines a space (a target arrangement space) in which the target 31 is disposed and a processing space S in which the substrate exists. The partition 60 includes a first partition plate 61 and a second partition plate 62 provided below the first partition plate 61. Both of the first partition plate 61 and the second partition plate 62 form a truncated cone shape along the cover 10b of the processing container 10, and are provided so as to be vertically overlapped with each other. An opening having a size corresponding to the target 31 is formed in the first partition plate 61 and the second partition plate 62. Further, the first partition plate 61 and the second partition plate 62 are configured to be independently rotatable by a rotation mechanism 63. Then, the first partition plate 61 and the second partition plate 62 may be rotated to take an open state where the opening corresponds to the two targets 31 or a close state (defined state) where the opening is in a position other than the position corresponding to the two targets 31. When the first partition plate 61 and the second partition plate 62 are in the open state, the center of the target 31 and the center of the opening are aligned with each other. When the first partition plate 61 and the second partition plate 62 become the open state, the shielding by the partition 60 is released, and thus, the deposition of the metal film on the substrate W by sputtering becomes possible. Meanwhile, when the first partition plate 61 and the second partition plate 62 become the close state, the target arrangement space and the processing space S are defined.

The second partition plate 62 becomes the close state when the first partition plate 61 is in the open state and sputter-cleaning is performed on the target 31, and shields such that sputter particles are not radiated to the processing space when performing the sputter-cleaning on the target 31.

A shield member 65 is provided above the substrate holder 20 so as to reach from an outer end portion of the upper surface of the substrate holder 20 to the vicinity of a lower end of the partition 60. The shield member 65 has a function of suppressing the oxidizing gas supplied from the oxidizing gas introducing mechanism 50 from being diffused to the target 31 side.

The controller 70 is constituted by a computer, and includes a main controller constituted by a CPU that controls respective components of the film forming apparatus 1, for example, the power supply 36, the exhaust device 12, the driving unit 25, the gas supply 40, the oxidizing gas introducing mechanism 50, and the rotation mechanism 63 of the partition 60. Further, additionally, the controller 70 includes an input device such as a keyboard and a mouse, an output device, a display device, and a storage device. By setting a storage medium that stores a processing recipe in the storage device, the main controller of the controller 70 causes the film forming apparatus 1 to execute a predetermined operation based on the processing recipe loaded from the storage medium.

Next, descriptions will be made on an operation of the film forming apparatus configured as described above.

First, the gate valve 14 is opened, and the substrate W is carried into the processing container 10 by a transfer device (not illustrated) from transfer chamber (not illustrated) adjacent to the processing container 10, and is held on the substrate holder 20.

Figure 6:
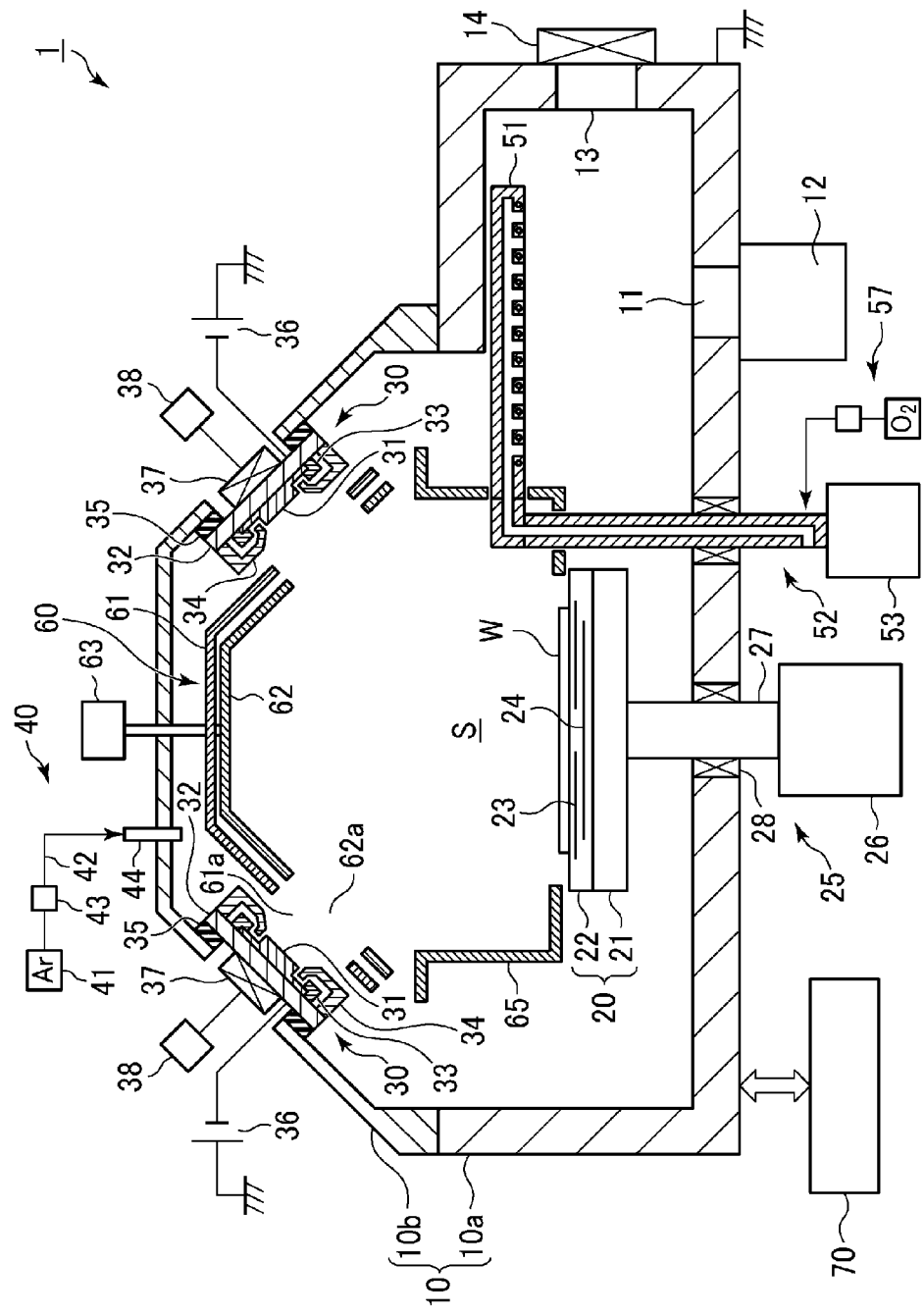
FIG. 6 is a cross-sectional view illustrating a state of the film forming apparatus according to an embodiment when depositing a metal film.

Then, a film forming processing is started. First, a metal film, for example, a Mg film or an Al film is deposited on the substrate W on the substrate holder 20 by sputtering. At this time, prior to the deposition of the metal film, as illustrated in FIG. 6, in the film forming apparatus 1, the partition 60 becomes the open state. Specifically, the first and the second partitions 61 and 62 become the open state in which openings 61a and 62a thereof are in a position corresponding to the target 31 (i.e., the center of the openings 61a and 62a are aligned with the center of the target 31). Further, the head 51 of the oxidizing gas introducing mechanism 50 is in a state where it exists at the retreat position.

Figure 7:
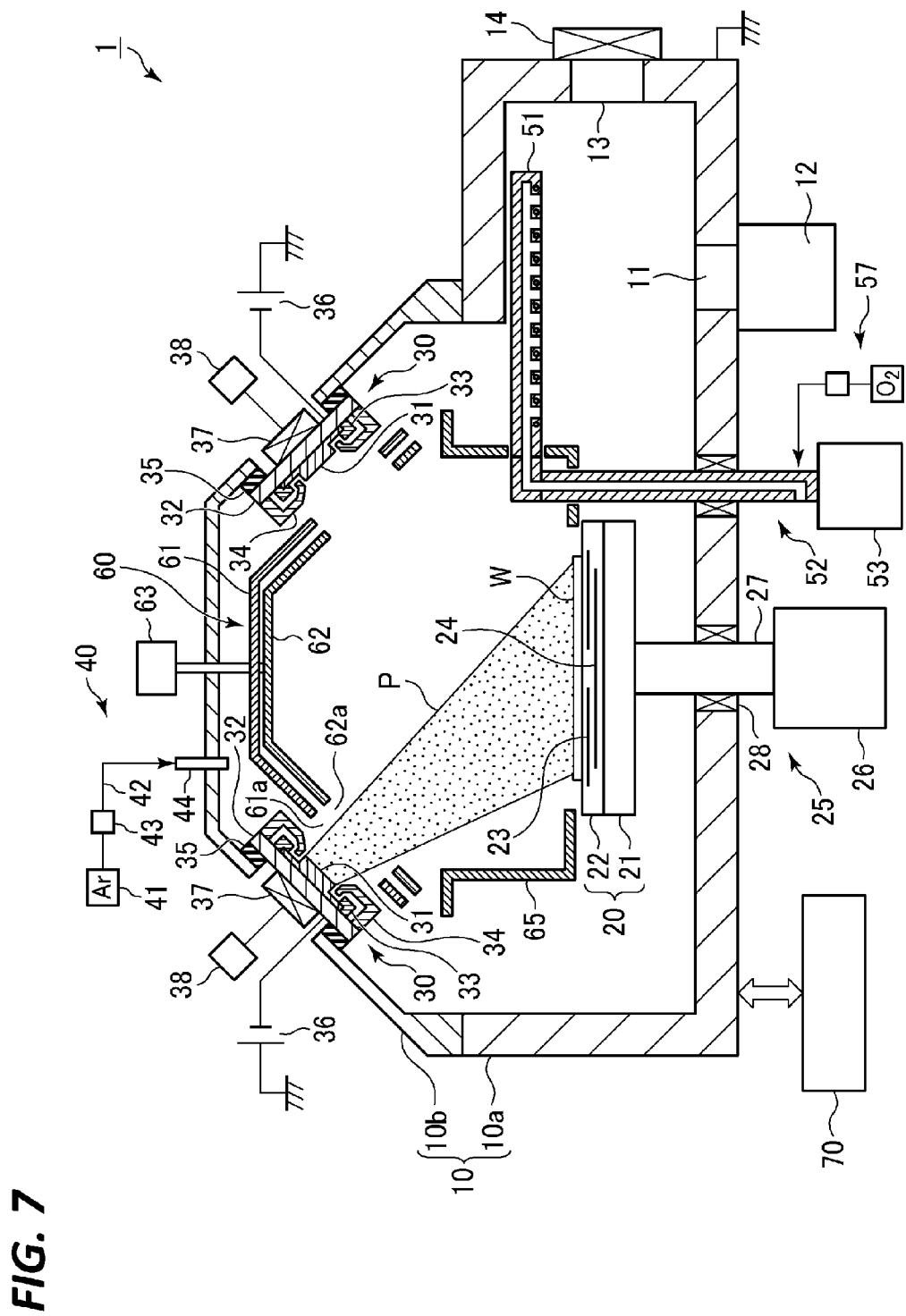
FIG. 7 is a cross-sectional view illustrating a state where sputter particles are emitted from the target, in the film forming apparatus in the state in FIG. 6.

Specifically, sputtering is performed as follows. First, an inert gas, for example, an Ar gas is introduced into the processing container 10 from the gas supply 40 while regulating the inside of the processing container 10 to a predetermined pressure by the exhaust device 12. Subsequently, plasma is generated by applying a voltage to the target 31 through the target holder 31 from the power supply 36, and the cathode magnet 37 is driven to generate a magnetic field. Therefore, positive ions in the plasma collide with the target 31, and as illustrated in FIG. 7, sputter particles P constituted by the constituent metal are emitted from the target 31. A metal film is deposited on the substrate W by the emitted sputter particles P. At this time, as described above, the sputter particles may be emitted from both of the two targets 31, or the sputter particles may be emitted from one of the two targets 31. A state where the sputter particles P are emitted from one target 31 is illustrated in FIG. 7. The pressure at the time of sputtering may be in a range of $1\times10^{-5}$ to $1\times10^{-2}$ Torr ($1.3\times10^{-3}$ to 1.3 Pa).

Subsequently, an oxidizing gas, for example, $O_2$ gas is supplied to the substrate W held by the substrate holder 20, and the metal film deposited on the substrate W is oxidized to form a metal oxide film. At this time, the head 51 of the oxidizing gas introducing mechanism 50 is moved to the oxidation processing position immediately above the substrate holder 20, and the oxidizing gas is supplied to the substrate W from the head 51 of the oxidizing gas introducing mechanism 50. Further, the substrate W is heated by the heater 24 at a temperature of, for example, 50° C. to 300° C. After forming the oxide film, the substrate W may be heated again by the heater 51c to a temperature of, for example, 250° C. to 400° C. to crystallize the metal oxide film. The pressure at this time may be in a range of $1\times10^{-7}$ to $2\times10^{-2}$ Torr ($1.3\times10^{-5}$ to 2.6 Pa).

Subsequently, the inert gas supplied to the processing container 10 when performing the sputtering, and the oxidizing gas supplied into the processing container 10 when forming the metal oxide film are discharged from the processing container 10 by vacuum evacuation.

The metal oxide film having a desired film thickness is formed by repeating the formation of the metal film by sputtering, oxidation of the metal film by the oxidizing gas, and discharging the gas in the processing container 10 as described above, one or more predetermined times.

As necessary, prior to the deposition of the metal film by sputtering, the first partition plate 61 may become the open state, and the second partition plate 62 may become the close state, and then a voltage may be applied to the target 31 and the sputter-cleaning may be performed on the target 31. Therefore, a natural oxide film on the surface of the target 31 is removed. At this time, the sputter particles are deposited on the second partition plate 62. After finishing the sputter-cleaning, the partition 60 becomes the open state by causing the partition plate 62 to be in the open state, and the deposition of the metal film by the sputtering is performed.

According to the embodiment, since the deposition of the metal film and the oxidation processing may be performed in one processing container, it is possible to perform the formation of the metal oxide film in a short time as in the technique of Japanese Patent Laid-Open Publication No. 2016-033244.

Meanwhile, when forming a film by sputtering, sputter particles may wrap around the wall portion of the processing container or a member on the back surface of the target, and be attached thereto, and thus may adversely affect the processing. However, a means configured to suppress sputter particles from being attached described above is not disclosed in Japanese Patent Laid-Open Publication No. 2016-033244. Further, Japanese Patent Application No. 6095806 discloses that an anti-deposition member (corresponding to the anti-deposition shield according to the present embodiment) is provided around the target to suppress sputter particles from being directly attached to the inner surface of the processing container, but does not consider the wrapping around to the member on the back surface of the target.

Therefore, in the embodiment, the anti-deposition shield 34 is provided around the main body 31a of the target 31 to cover the flange 31b of the target 31, the target clamp 33, and the target holder 32. Then, the inner portion 34c that constitutes the inner tip end of the anti-deposition shield 34 is provided to enter a recess 33a between the main body 31a of the target 31 and the target clamp 33 so as to have a labyrinth structure. As a result, it is possible to efficiently suppress the sputter particles emitted from the target 31 from wrapping around not only the inner wall of the processing container 10, but also the target clamp 33 or the target holder 32.

Further, with the slope 34d formed in the intermediate portion 34b of the anti-deposition shield 34, the space 34e surrounded by the anti-deposition shield 34 (the intermediate portion 34b) is formed above the target 31. Therefore, it is possible to increase the pressure of the Ar gas to be easily discharged.

Figure 8:
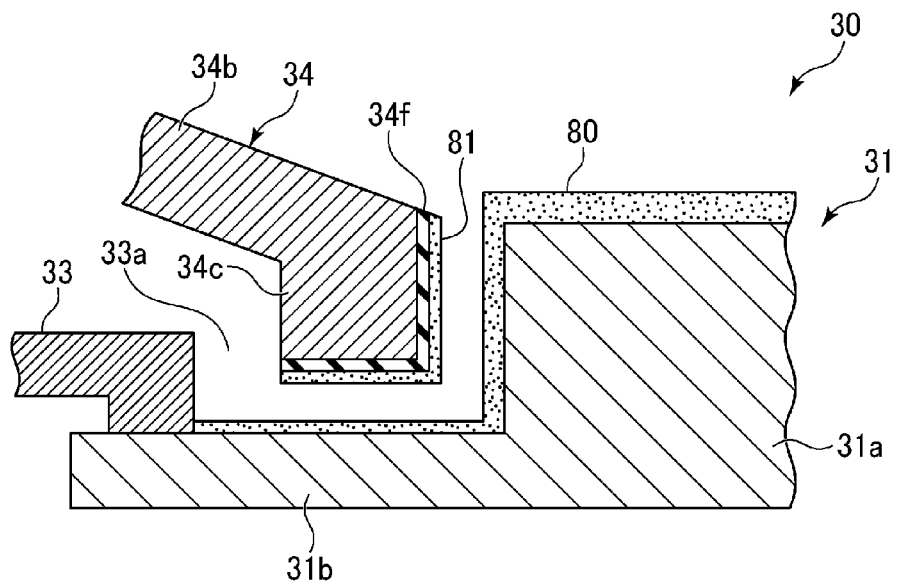
FIG. 8 is a cross-sectional view illustrating a state where, when repeating deposition of a metal and an oxidation processing, a metal oxide film is attached to a surface of a target surface and a surface of the anti-deposition shield, in the film forming apparatus according to an embodiment.

Meanwhile, in the embodiment, similarly to the technique disclosed in Japanese Patent Laid-Open Publication No. 2016-033244, the sputtering film formation and the oxidation processing are performed in the processing container 10, and thus, as illustrated in FIG. 8, when repeating the deposition of the metal and the oxidation processing, metal films 80 and 81 are attached on the surface of the target 31 and the surface of the anti-deposition shield 34, respectively.

As described above, the anti-deposition shield itself has been used in the related art. However, in the related art, the anti-deposition shield is made of a metal such as Al, and also, the surface of the anti-deposition shield in the vicinity of the target has an uneven shape (increased surface area) so that the attached substances do not peel off to be separated. For example, in the case of Al, the surface roughness Ra is in a range of 18 µm to 28 µm.

Figure 9:
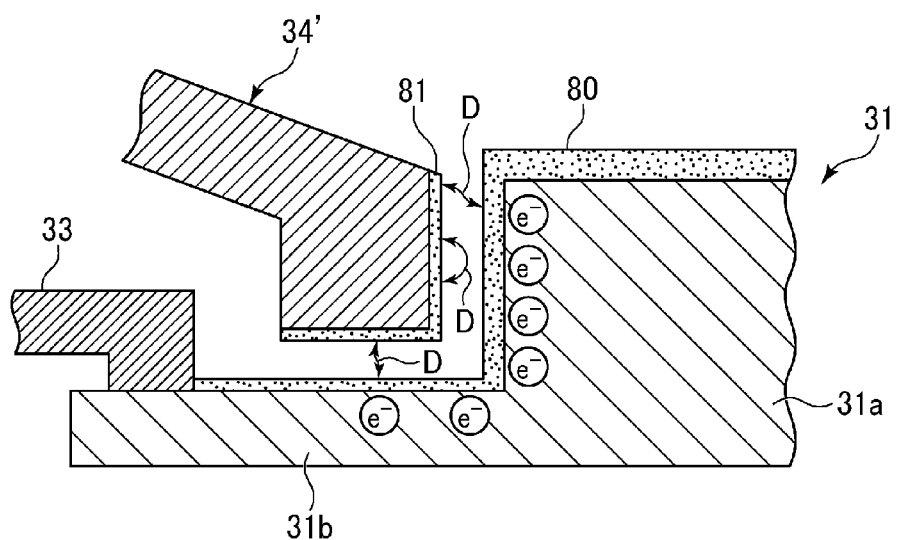
FIG. 9 is a view for explaining a mechanism of arc discharge generation when an anti-deposition shield made of a metal is used.
Figure 10:
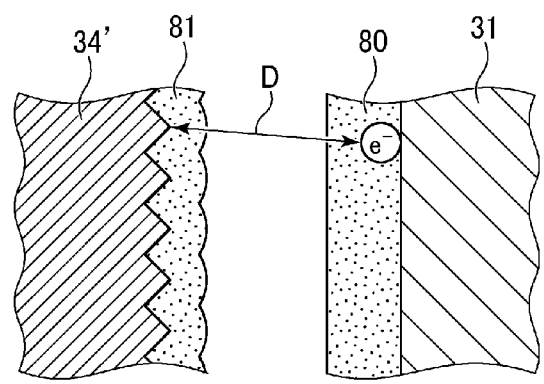
FIG. 10 is an enlarged cross-sectional view illustrating a portion in which an arc is generated in FIG. 9.

Since a voltage is applied to the target 31 in a state where the metal film 80 is attached to the surface, as illustrated in FIG. 9, electrons supplied to the target 31 are accumulated (charged up) in the metal oxide film 80. As illustrated in FIG. 9, when using an anti-deposition shield 34' in the related art made of a metal having an uneven surface as an anti-deposition shield, the metal oxide film 81 is directly attached to the metallic anti-deposition shield 34', but the metal oxide film 81 also contains a conductor that has not been oxidized. Therefore, the electrons charged up in the metal oxide film 80 of the target 31 are released at a stretch toward the closest protruding portion of the anti-deposition shield 34' via the conductor in the metal oxide film 81, and arc discharge (micro arc discharge) D is generated locally (see FIGS. 9 and 10). When such arc discharge is generated, the thickness of the metal film when performing the sputtering film formation is reduced, and thus, it becomes difficult to stably produce elements having the same characteristics.

Therefore, in the embodiment, the anti-deposition shield 34 is configured to have the insulating film 34f on the surface of the inner portion 34c facing the target 31 (the main body 31a and the flange 31b). Since the electrons charged up in the metal oxide film 80 attached to the target 31 may not move to the insulating film 34f, it is possible to effectively suppress the arc discharge to the anti-deposition shield 34.

At this time, when covering the entire surface of the anti-deposition shield 34 with the insulating film, the electrons in the plasma at the time of the sputtering lose their place to go, and the sputter discharge becomes unstable, and thus, the insulating film 34f may be formed in a part of the anti-deposition shield 34.

Further, an oxide film such as $Al_2O_3$, MgO, or $SiO_2$, or a nitride film such as MN may be used as the insulating film 34f. Further, the insulating film 34f may be a sprayed film. When the base material of the anti-deposition shield 34 is Al, it is appropriate to use $Al_2O_3$ as the insulating film 34f.

Actually, an experiment is performed using an anti-deposition shield that is made of Al, has the surface of the tip end portion made uneven (surface roughness Ra=18 µm to 28 µm) by Al spraying, and is provided with the $Al_2O_3$ sprayed film as the insulating film on the surface facing the target, and an anti-deposition shield that is not provided with the $Al_2O_3$ sprayed film.

The sputtering and the oxidation processing using Mg as the target are repeated to grasp the change in the number of the micro arc generations. The sputtering is performed under the conditions where the supplied power: 700 W, Ar gas flow rate: 400 sccm, and time: 4 sec. Further, the oxidation processing is performed under the conditions where $O_2$ gas flow rate: 2,000 sccm and time: 30 sec. The pressure at the processing is $2 \times 10^{-2}$ Torr, and the temperature is room temperature. The results are illustrated in FIG. 11.

Figure 11:
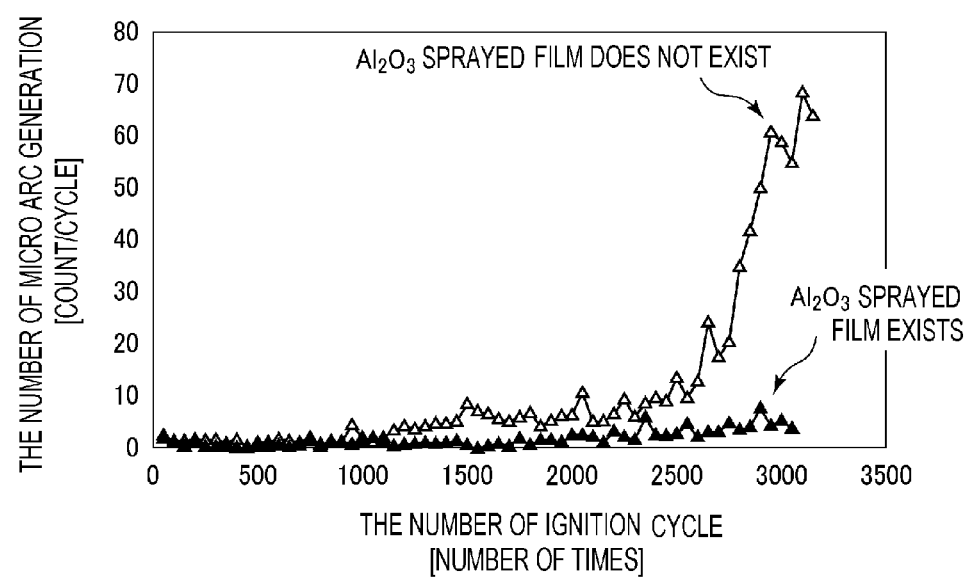
FIG. 11 is a view comparing and illustrating frequencies of micro arc generation in a case where an $Al_2O_3$ sprayed film is formed on a surface of the anti-deposition shield facing the target and a case where an $Al_2O_3$ sprayed film is not formed on a surface of the anti-deposition shield facing the target.

As illustrated in FIG. 11, when using the anti-deposition shield without the $Al_2O_3$ sprayed film, the number of micro arcs dramatically increases at a certain number of ignition cycles. With regard to this, when using the anti-deposition shield provided with the $Al_2O_3$ sprayed film, a dramatic increase of the micro arc is not observed.

For example, in the above embodiment, the sputtering method for forming a metal film is an example, and another sputtering method may be used, or sputter particles may be emitted by a method different from the present disclosure. Further, although an example in which an oxidizing gas is supplied to a substrate from a head above the substrate is illustrated, the present disclosure is not limited thereto.

Further, in the above embodiment, a film forming apparatus having an oxidizing gas introducing mechanism that forms a metal film by sputtering, and then, oxidizes the metal film is illustrated, but a film forming apparatus configured to form a metal film without an oxidizing gas introducing mechanism may be used.

In the above embodiment, an example in which an insulating film is formed on a surface of an anti-deposition shield facing a target is illustrated, but the surface of the anti-deposition shield facing the target may be an insulator, or the whole tip end portion including the surface of the anti-deposition shield facing the target may be an insulator, or may be a metal bonded with a bulk insulator.

According to the present disclosure, a film forming apparatus capable of efficiently suppressing sputter particles emitted from a target from wrapping around a processing container wall portion or a member on a back surface of the target is provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film forming apparatus comprising:
   a processing container;
   a substrate holder configured to hold a substrate in the processing container;
   a target assembly disposed in an upper side of the substrate holder; and
   a partition plate provided below the target assembly and above the substrate holder, and configured to define a space in which the target assembly is disposed and a processing space in which the substrate is provided,
   wherein the target assembly includes:
   a target made of metal, including a main body and a flange provided around the main body to form an annular shape, and configured to emit sputter particles from the main body;
   a target holder including a target electrode that supplies power to the target and is configured to hold the target;
   a target clamp configured to clamp the flange of the target to the target holder; and
   an anti-deposition shield provided around the main body of the target to cover the flange, the target clamp, and the target holder, the anti-deposition shield being directly attached to the target holder and having a labyrinth structure in which an inner tip end thereof is disposed to enter a recess between the main body of the target and the target clamp, and a surface of the inner tip end of the anti-deposition shield that faces a side surface of the main body and a top surface of the flange being covered with an insulating film, and wherein the partition plate is provided to cover an entire front surface of the target assembly.

2. The film forming apparatus according to claim 1, wherein the anti-deposition shield includes:
an outer portion directly attached to the target holder outside the target clamp, and extending to a position higher than a height of the main body of the target so as to be away from the target holder;
an intermediate portion extending from an inner end of the outer portion toward a center of the target, and having a slope approaching to the main body of the target toward the center of the target; and
an inner portion extending downward from an inner end of the intermediate portion, and including the inner tip end that enters the recess between the main body of the target and the target clamp.

3. The film forming apparatus according to claim 1, wherein an inlet includes a head provided to be movable between an oxidation processing position existing in the processing space and a retreat position away from the processing space, and configured to supply oxidizing gas to the substrate when the head is in the oxidation processing position.

4. The film forming apparatus according to claim 1, wherein:
the partition plate is provided on a lower end of a rotational axis that passes through a ceiling portion of the processing container,
the partition plate includes a first partition plate and a second partition plate provided below the first partition plate, and
each of the first partition plate and the second partition plate is provided with an opening that has a size corresponding to the target.

5. The film forming apparatus according to claim 4, wherein the first partition plate and the second partition plate are independently rotatable around the rotational axis by a rotation driver.

6. The film forming apparatus of claim 1, wherein the partition plate is arranged in parallel with the front surface of the target assembly.

7. A film forming apparatus comprising:
a processing container;
a substrate holder configured to hold a substrate in the processing container;
a target assembly disposed in an upper side of the substrate holder;
an inlet configured to supply an oxidizing gas to the substrate held by the substrate holder; and
a partition plate provided below the target assembly and above the substrate holder, and configured to define a space in which the target assembly is disposed and a processing space in which the substrate is provided,
wherein the target assembly includes:
a target made of metal, including a main body and a flange provided around the main body to form an annular shape, and configured to emit sputter particles from the main body;
a target holder including a target electrode that supplies power to the target and configured to hold the target;
a target clamp configured to clamp the flange of the target to the target holder; and
an anti-deposition shield provided around the main body of the target to cover the flange, the target clamp, and the target holder, the anti-deposition shield being directly attached to the target holder and having a labyrinth structure in which an inner tip end thereof is disposed to enter a recess between the main body of the target and the target clamp,
the target is supplied with a power through the target electrode to emit constituent metal as sputter particles, thereby depositing a metal film on the substrate, and the metal film is oxidized by the oxidizing gas introduced from the inlet, thereby forming a metal oxide film, and
the anti-deposition shield is made of metal, and a surface of an inner tip end of the anti-deposition shield that faces a side surface of the main body and a top surface of the flange is covered with an insulating film,
wherein the partition plate is provided to cover an entire front surface of the target assembly.

8. The film forming apparatus according to claim 7, wherein the insulating film is selected from an $Al_2O_3$ film, a MgO film, a $SiO_2$ film, and an AlN film.

9. The film forming apparatus according to claim 8, wherein the insulating film is a sprayed film.

10. The film forming apparatus according to claim 9, wherein a metal portion of the anti-deposition shield on which the insulating film is formed is Al, and the insulating film is an $Al_2O_3$ sprayed film.

11. The film forming apparatus according to claim 10, wherein a surface roughness Ra of the metal portion of the anti-deposition shield on which the insulating film is formed is in a range of 18 μm to 28 μm, a surface roughness Ra of the $Al_2O_3$ sprayed film is in a range of 2.2 μm to 4.2 μm, and a thickness of the $Al_2O_3$ sprayed film is in a range of 150 μm to 250 μm.

12. The film forming apparatus according to claim 7, wherein the insulating film is a sprayed film.

13. The film forming apparatus according to claim 7, wherein the anti-deposition shield has:
an outer portion directly attached to the target holder outside the target clamp, and extending to a position higher than a height of the main body of the target so as to be away from the target holder;
an intermediate portion extending from an inner end of the outer portion toward a center of the target, and having a slope approaching to the main body of the target toward the center of the target; and
an inner portion extending downward from an inner end of the intermediate portion, and including the inner tip end that enters the recess between the main body of the target and the target clamp.

14. The film forming apparatus according to claim 13, wherein the inlet includes a head provided to be movable between an oxidation processing position existing in a processing space and a retreat position away from the processing space, and configured to supply the oxidizing gas to the substrate when the head is in the oxidation processing position.

15. The film forming apparatus according to claim 7, wherein:
the partition plate is provided on a lower end of a rotational axis that passes through a ceiling portion of the processing container,
the partition plate includes a first partition plate and a second partition plate provided below the first partition plate, and
each of the first partition plate and the second partition plate is provided with an opening that has a size corresponding to the target.

16. The film forming apparatus according to claim 15, wherein the first partition plate and the second partition plate are independently rotatable around the rotational axis by a rotation driver.

17. The film forming apparatus of claim 7, wherein the partition plate is arranged in parallel with the front surface of the target assembly.

\* \* \* \* \*